(12) United States Patent
Wimplinger

(10) Patent No.: US 11,764,198 B2
(45) Date of Patent: Sep. 19, 2023

(54) METHOD AND DEVICE FOR BONDING OF CHIPS

(71) Applicant: EV Group E. Thallner GmbH, St. Florian am Inn (AT)

(72) Inventor: Markus Wimplinger, Ried in Kreis (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 16/483,077

(22) PCT Filed: Mar. 2, 2017

(86) PCT No.: PCT/EP2017/054971
§ 371 (c)(1),
(2) Date: Aug. 2, 2019

(87) PCT Pub. No.: WO2018/157937
PCT Pub. Date: Sep. 7, 2018

(65) Prior Publication Data
US 2020/0176437 A1 Jun. 4, 2020

(51) Int. Cl.
*H01L 25/00* (2006.01)
*H01L 23/00* (2006.01)
*H01L 25/065* (2023.01)
*H05K 13/04* (2006.01)

(52) U.S. Cl.
CPC ............. *H01L 25/50* (2013.01); *H01L 24/74* (2013.01); *H01L 24/75* (2013.01); *H01L 24/80* (2013.01); *H01L 25/0652* (2013.01); *H05K 13/0404* (2013.01); *H01L 2224/80003* (2013.01); *H01L 2224/80011* (2013.01); *H01L 2224/80013* (2013.01); *H01L 2224/80894* (2013.01)

(58) Field of Classification Search
CPC ...................................................... H01L 21/78
See application file for complete search history.

(56) References Cited

U.S. PATENT DOCUMENTS

| 6,214,692 | B1 | 4/2001 | Thallner |
| 7,714,336 | B2 | 5/2010 | Imai |
| 8,042,593 | B2 | 10/2011 | Yoon et al. |
| 8,330,245 | B2 | 12/2012 | Pitney et al. |
| 8,440,541 | B2 | 5/2013 | Pitney et al. |
| 8,461,017 | B2 | 6/2013 | Sadaka et al. |
| 8,575,002 | B2 | 11/2013 | Broekaart et al. |
| 8,642,444 | B2 | 2/2014 | Fujii |

(Continued)

FOREIGN PATENT DOCUMENTS

| CN | 105236350 B | 6/2017 |
| JP | H04220169 A | 8/1992 |

(Continued)

OTHER PUBLICATIONS

International Search Report from corresponding International Patent Application No. PCT/EP2017/054971, dated Jan. 22, 2018.

(Continued)

*Primary Examiner* — Bryan R Junge
(74) *Attorney, Agent, or Firm* — KUSNER & JAFFE

(57) ABSTRACT

A method and device for bonding chips onto a substrate or onto further chips. The chips are bonded onto the substrate or the further chips by means of a direct bond.

11 Claims, 5 Drawing Sheets

(56) References Cited

U.S. PATENT DOCUMENTS

| | | | |
|---|---|---|---|
| 9,040,385 B2 | 5/2015 | Chen et al. | |
| 9,530,687 B2 | 12/2016 | Fujii | |
| 10,217,791 B2 | 2/2019 | Fujii | |
| 10,438,921 B2 | 10/2019 | Fournel et al. | |
| 10,497,589 B2* | 12/2019 | Panitz | H01L 24/98 |
| 2003/0115747 A1* | 6/2003 | Schnetzler | H01L 24/75 29/830 |
| 2004/0238112 A1* | 12/2004 | Cheung | H01L 24/83 156/285 |
| 2005/0221582 A1* | 10/2005 | Lee | B23K 37/047 438/455 |
| 2007/0193682 A1* | 8/2007 | Sasaoka | H01L 21/6835 156/281 |
| 2007/0287264 A1 | 12/2007 | Rogers | |
| 2008/0233680 A1* | 9/2008 | Okamoto | H01L 24/29 414/217 |
| 2008/0283849 A1 | 11/2008 | Imai | |
| 2009/0020229 A1 | 1/2009 | Yoon et al. | |
| 2010/0248424 A1* | 9/2010 | Luce | H01L 24/94 257/E21.705 |
| 2011/0045611 A1* | 2/2011 | Castex | H01L 21/76251 438/5 |
| 2011/0128399 A1 | 6/2011 | Fujii | |
| 2011/0204471 A1 | 8/2011 | Pitney et al. | |
| 2011/0207246 A1 | 8/2011 | Pitney et al. | |
| 2012/0077329 A1 | 3/2012 | Broekaart et al. | |
| 2013/0075868 A1* | 3/2013 | Sadaka | H01L 27/0688 257/617 |
| 2013/0270711 A1* | 10/2013 | Hebding | H01L 21/76229 257/774 |
| 2013/0320567 A1 | 12/2013 | Thacker et al. | |
| 2014/0120654 A1 | 5/2014 | Fujii | |
| 2015/0048523 A1* | 2/2015 | Suga | H01L 24/13 228/104 |
| 2015/0179605 A1* | 6/2015 | Dubey | H01L 24/33 257/777 |
| 2015/0228535 A1 | 8/2015 | Sadaka et al. | |
| 2015/0228622 A1* | 8/2015 | Koyanagi | H01L 24/83 257/777 |
| 2016/0190087 A1* | 6/2016 | Yu | H01L 24/75 156/538 |
| 2016/0240439 A1* | 8/2016 | Yu | H01L 21/78 |
| 2017/0084647 A1 | 3/2017 | Fujii | |
| 2019/0363068 A1* | 11/2019 | Hotta | H01L 24/80 |

FOREIGN PATENT DOCUMENTS

| | | |
|---|---|---|
| JP | 4064808 B2 | 3/2008 |
| JP | 2013243333 A | 12/2013 |
| JP | 2013521405 A | 12/2013 |
| JP | 2015-018897 A | 1/2015 |
| KR | 10-1335275 B1 | 11/2013 |
| KR | 10-2015-0006845 A | 1/2015 |
| TW | 200847388 A | 12/2008 |
| TW | 201137957 A1 | 11/2011 |
| TW | 201140694 A1 | 11/2011 |
| TW | 201205688 A1 | 2/2012 |
| TW | 201214612 A1 | 4/2012 |
| TW | I430390 B | 3/2014 |
| TW | 201505088 A | 2/2015 |
| WO | WO 2012/100786 A1 | 8/2012 |
| WO | WO 2012/136266 A1 | 10/2012 |
| WO | WO 2012/136267 A1 | 10/2012 |
| WO | WO 2012/136268 A1 | 10/2012 |
| WO | WO 2014/015899 A1 | 1/2014 |
| WO | WO 2014/191033 A1 | 12/2014 |
| WO | WO 2014/202106 A1 | 12/2014 |
| WO | WO 2015/082020 A1 | 6/2015 |
| WO | WO 2015/107290 A2 | 7/2015 |
| WO | WO2016060274 | 4/2016 |
| WO | WO 2017/021231 A1 | 2/2017 |
| WO | WO 2017/140347 A1 | 8/2017 |
| WO | WO 2017/162272 A1 | 9/2017 |
| WO | WO 2018/028801 A1 | 2/2018 |

OTHER PUBLICATIONS

Office Action issued in related Korean Patent Application No. 10-2019-7020905 dated Dec. 30, 2021 along with the English-language translation.

Office Action issued in related Japanese Patent Application No. 2019-541070 dated Nov. 16, 2021 along with the English-language translation.

Office Action (with English-language translation) dated Jul. 22, 2022 from corresponding European Patent Appl. No. 17710159.9.

Office Action issued in related Taiwanese Patent Application No. 109137666 corresponding to Taiwanese Publication No. 202121610A; and in related Taiwanese Patent Application No. 107105628 corresponding to Taiwanese Publication No. 201842630A dated Jul. 5, 2022 along the English-language machine translation.

Office Action issued in related Taiwanese Patent Application No. 11220576820 dated Jun. 16, 2023 along with the English-language translation.

* cited by examiner

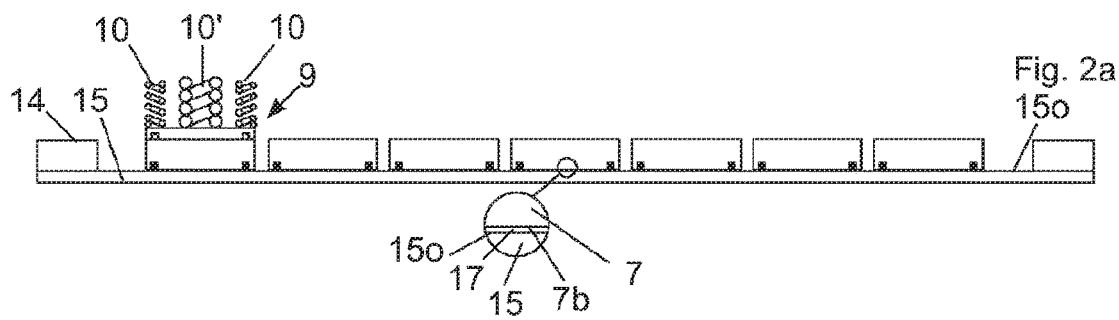
Fig. 2a
Fig. 2b
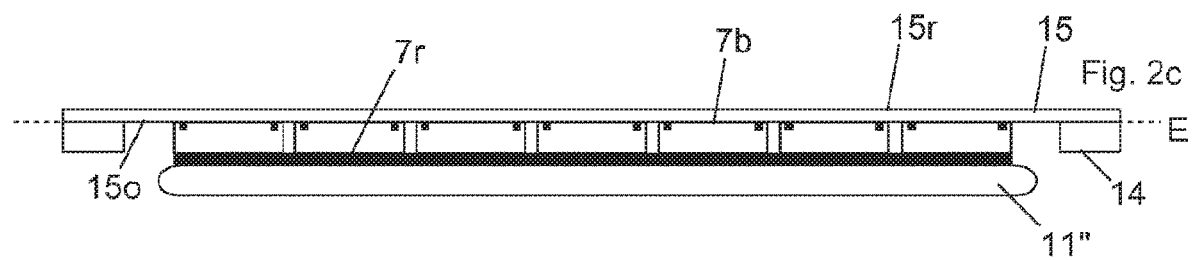
Fig. 2c
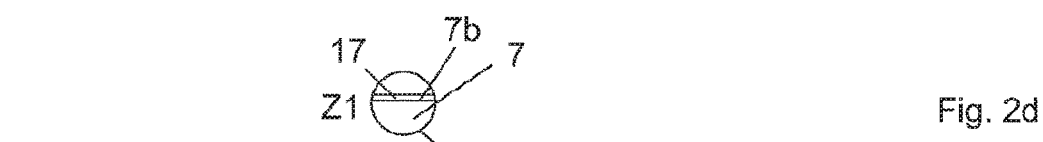
Fig. 2d
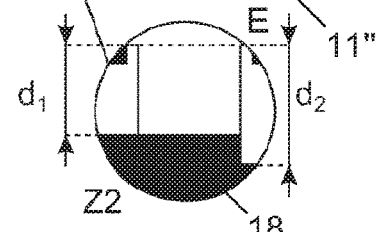
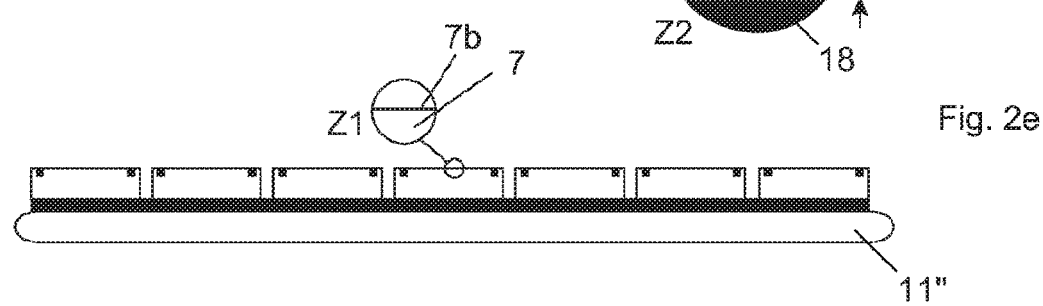
Fig. 2e

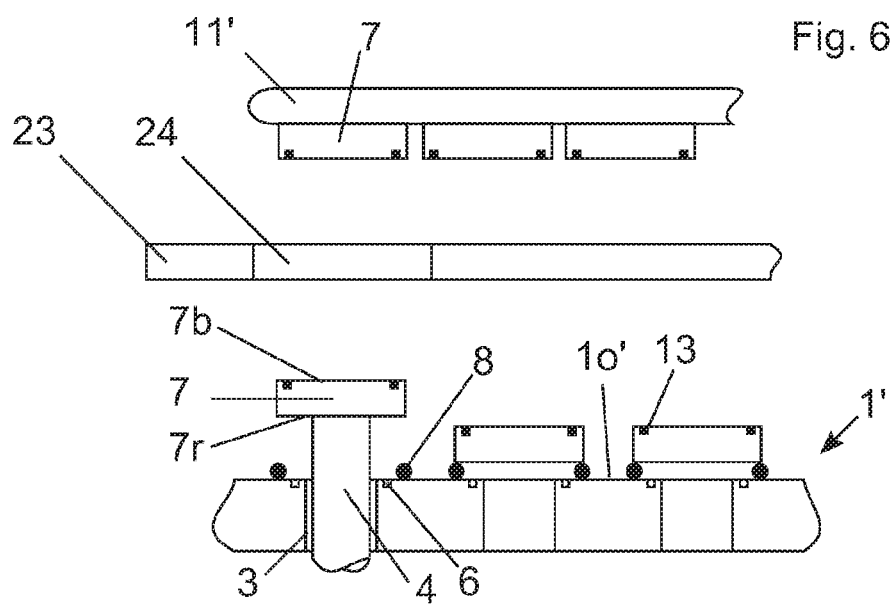
Fig. 6
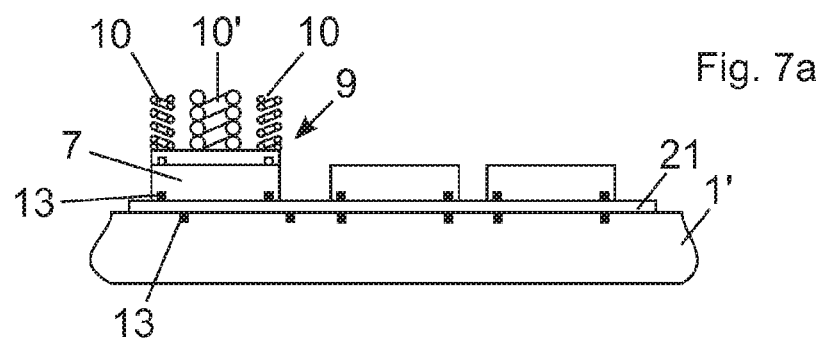
Fig. 7a
Fig. 7b
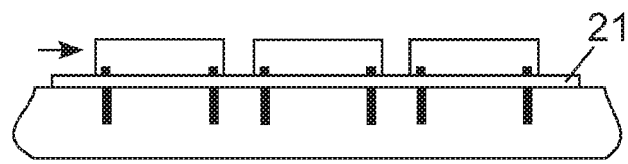
Fig. 8a  Fig. 8b
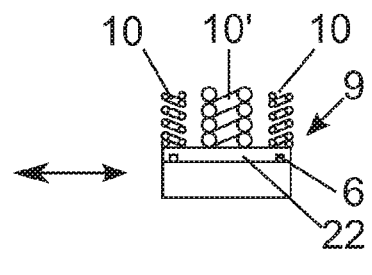
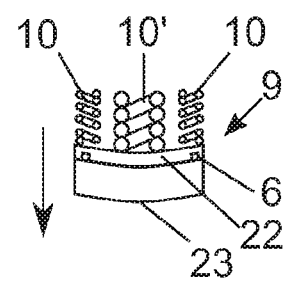

METHOD AND DEVICE FOR BONDING OF CHIPS

FIELD OF THE INVENTION

The invention relates to a method and a device for bonding chips.

BACKGROUND OF THE INVENTION

Chip-to-wafer (C2W) or chip-to-chip (C2C) processes are described in the prior art via solder balls or copper pillars with solder caps. However, the solder balls or copper pillars with solder caps, respectively, are extremely large and increase the thickness of the chips produced in this way.

SUMMARY OF THE INVENTION

It is an object of the present invention to provide an improved bonding method or an improved bonding device, respectively, or an improved product, respectively.

This object is solved by means of the subject matter of the independent patent claims. Advantageous further developments of the invention are specified in the subclaims. All combinations of at least two features specified in the description, the claims and/or the figures also fall within the scope of the invention. In the case of specified value ranges, values within the mentioned boundaries shall also be considered as being disclosed as threshold values and shall be capable of being claimed in any combination.

According to the invention, provision is made for a method for bonding chips onto a substrate, in particular semiconductor substrate, or onto further chips, wherein the chips are bonded onto the substrate or the further chips by means of a direct bond. A direct bond is understood to be a bond, which forms directly via the interaction of two surfaces, without forming a liquid phase. According to another term definition, a direct bond is understood to be a bond, in the case of which no additional materials need to be used. A direct bond is in particular understood to be a metal-metal solid body bond, in particular diffusion bond, a prebond or a fusion bond resulting from the prebond, respectively, or a hybrid bond, i.e. a bond, which is based on fusion bond portions and metal bond portions.

According to the invention, provision is furthermore made for a device for bonding chips onto a substrate or further chips, wherein the chips can be bonded onto the substrate or the further chips by means of a direct bond.

According to the invention, provision is furthermore made for a chip stack of chips, wherein the chips are bonded to one another by means of a direct bond.

According to the invention, provision is furthermore made for a substrate comprising chips (product), wherein the chips are bonded onto the substrate by means of a direct bond.

According to the invention, a direct bond option on C2C or C2W level is made possible. Advantageously, solder balls or copper pillars with solder caps are no longer required. The thicknesses of the produced chip stacks or products, respectively, become smaller, the throughput is increased and the efficiency of the chip communication increases. The direct bond in particular has a bond strength of more than 0.1 $J/m^2$, preferably more than 0.5 $J/m^2$, more preferably more than 1.0 $J/m^2$, most preferably more than 2.0 $J/m^2$, most preferably of all more than 2.5 $J/m^2$. The direct bond in particular occurs at temperatures of less than 400° C., preferably less than 300° C., more preferably at less than 2000° C., most preferably less than 150° C., most preferably of all less than 100° C. The direct bond furthermore occurs without the production of a liquid phase.

The invention is based on the idea of keeping the surface of a chip so clean that a following direct bond step can occur. The chips prepared in this way comprising a contamination-free bond surface can then be bonded onto the substrate (chip-to-wafer, C2W) or onto other chips (chip-to-chip, C2C).

In the further course of the present disclosure, a substrate or semiconductor substrate, respectively, is understood to be a not yet separated, in particular round, semi-finished product or the semiconductor industry. Particularly preferably, a substrate is a wafer. The substrates can have any shape, but are preferably circular. The diameter of the substrates is in particular standardized in the industry. For wafers, the industry-standard diameters are 1 inch, 2 inches, 3 inches, 4 inches, 5 inches, 6 inches, 8 inches, 12 inches and 18 inches. On principle, however, the embodiment according to the invention can handle every substrate, regardless of the diameter thereof.

In the further course of the present disclosure, a chip will be understood to be a mostly rectangular part, which is obtained by separation of a semiconductor substrate (wafer). A chip typically includes an integrated circuit, which is created in response to treating the semiconductor substrate.

In the present disclosure, a bond surface is understood to be a surface, which will become part of a bond boundary surface at some point during a process. Specifically, the bond surface is understood to be the surface of a chip, which needs to be treated according to the invention, in particular cleaned, before the chip is bonded. If a chip is bonded onto a substrate, the substrate surface can also be identified as bond surface.

In a preferred embodiment, the bond surfaces are hybrid bond surfaces. A hybrid bond surface is understood to be a bond surface, which is comprised of metallic and dielectric regions and thus of metallic and dielectric bond surface parts. All of the methods and/or devices mentioned in the present disclosure, which refer to the direct bond in general, can thus be used for the bonding of hybrid surfaces. Preferably, the metallic and dielectric surface parts are largely located in one plane. In particular, the metallic surface parts are recessed with respect to the dielectric surface parts or protrude with regard to the dielectric surface parts by the less than 0.5 μm, preferably less than 100 nm, more preferably less than 50 nm, most preferably less than 10 nm.

Cleaning Method

In the further course of the present disclosure, a cleaning is understood to be the removal of contaminations of the bond surface by means of one and/or a plurality of the following methods:

wet-chemical cleaning, in particular
  with water, in particular
    CO2-containing water
  with alcohols
  with acids, in particular
    formic acid
    citric acid
    peroxomonosulphuric acid
    standard clean 1 (SC1)
    standard clean 2 (SC2)
  with bases, in particular
    NH4OH
plasma cleaning plasma incineration mechanical cleaning, in particular brushing A plasma cleaning is understood to be the generally highly energetic bombardment of a surface with the ionized parts of a plasma. The ions of the plasma are thereby accelerated by means of electrical and/or magnetic fields and have a non-negligible penetration depth. A plasma cleaning can be associated with the plasma activation of a surface.

A plasma incineration is understood to be the generally low-energetic cleaning process of organic substances from a surface. The cleaning thereby occurs in particular by means of oxidation of the organic species, in particular with oxygen and/or fluorine or any other suitable and ionizable oxidizing agent. The organic components oxidized by means of the plasma incineration are preferably discharged from the reaction chamber. This either occurs by means of a continuous flow of the plasma or by means of a sequential aerating and deaerating of the plasma chamber. In a more preferred embodiment, the incinerated and oxidized organic components, however, are bonded within the plasma chamber by means of chemical and/or physical processes, so that their return to the substrate surface is prevented. Complicated devices, which require a circulation of the plasma, are thus avoided.

A wet-chemical cleaning by means of one or a plurality of the above-mentioned liquids is optionally performed after the plasma incineration, so as to thus even further improve the cleanliness of the surface and/or the surface chemistry of the surfaces to be cleaned, in particular by means of termination of the surfaces with suitable species for the bonding, which are already known to the person of skill in the art. Advantageously, the method serves the purpose of removing particles, which were created in particular in response to the plasma incineration and/or which remained on the surface.

The cleaning of a bond surface can thus also be performed by means of a plurality of the mentioned methods. The cleaning can be performed on a chip or simultaneously on a plurality of chips. In particular individual chips can be cleaned in response to the transport between two stations.

Self Alignment

In a preferred embodiment, the chips are positioned, and a self alignment of the chips occurs. Self alignment is understood to be a positioning process of an object, in the case at hand of a chip, which is driven by physical laws of minimization.

The self alignment preferably occurs in that the chip is driven on a bond surface with extremely small adhesion, in particular caused by a liquid separated on the bond surface, into an, in particular centrical position between features of the bond surface.

It would be conceivable for example that for example four metallic regions, in particular metallic bond surfaces, such as contact pads, are located on the bond surface, in particular as part of a hybrid bond surface or vias. On its bond surface, the chip also has four regions. If one such chip is placed onto a liquid, it is to be assumed that more hydrophilic regions will position themselves above more hydrophilic regions and that more hydrophobic regions will position themselves above more hydrophobic regions. An alignment, in the case of which the metallic regions of the hybrid bond surfaces are made to be congruent, will thus occur.

It is clear to the person of skill in the art that such a self alignment can occur even better, the higher the symmetry of the structures, which are involved in the self alignment. This includes the geometry of the chips, the distances between the metallic regions of the hybrid bond surfaces, the shape of the metallic regions, etc. The chip should preferably be square. The metallic regions of the hybrid bond surface should furthermore preferably also be located at the corners of an imaginary square. A further advantage would be at hand, if the difference between the hydrophilicity and hydrophobicity of the corresponding hybrid bond regions is as large as possible. The contact angle, which forms between a test liquid drop, in particular water, and the surface to be measured, is one measure for the hydrophobicity or hydrophilicity, respectively. Hydrophilic surfaces flatten the liquid drop, because the adhesion forces between the liquid and the surface dominate over the cohesive forces of the liquid and thus form small contact angles. Hydrophobic surfaces lead to a spherical shape of the liquid drop, because the cohesive forces of the liquid dominate over the adhesive forces between the liquid and the surface. The contact angle difference between the two different mentioned hybrid bond regions is preferably larger than 1°, preferably larger than 5°, more preferably larger than 25°, most preferably larger than 50°, most preferably of all larger than 100°.

The liquid layer applied to the bond surface has a thickness of less than 2 mm, preferably less than 1.5 mm, more preferably less than 1 mm, most preferably less than 0.5 mm, most preferably of all less than 0.1 mm. The liquid is preferably water. However, the use of any other liquid, such as alcohols ethers acids bases is conceivable as well. In particular ethers have a very high steam pressure and thus evaporate almost completely from the surface, which automatically leads to a removal of the liquid after the attained self alignment. Advantageously, a pre-bond is automatically created between the surfaces after the removal of the liquid.

In a particular embodiment according to the invention, grooves, which facilitate or first provide for the removal of the liquid after the self alignment of the chip, are located on the bond surface of the substrate and/or of the chip, in particular in the dielectric regions. These grooves preferably lead from the region of the chip surface to the edge of the chip, so that the liquid can be removed to the outside by means of flowing and or evaporating, preferably automatically, more preferably with the support of the force of gravity, which leads to the liquid being pressed out.

Bonding Devices and Methods

A plurality of devices and processes according to the invention for bonding chips are disclosed. The methods according to the invention can be divided into individual bonding methods and collective bonding methods. The corresponding devices are thus devices for the individual bonding or for the collective bonding, respectively. All methods and devices according to the invention have in common that the bond surfaces of the chips need to be contamination-free until the bonding process. The process steps and systems according to the invention for reaching this goal will be described in more detail below.

Individual Bonding Devices and Methods

An individual bonding method is understood to be the processes, which are common in the prior art, for placing chips individually, i.e. consecutively, onto other chips (C2C) or onto a wafer (C2W). Such methods have the advantage that chips of different sizes and/or of different functionality can be bonded.

Separation on a Tape

In a first exemplary method according to the invention, a substrate is fixed onto a carrier, in particular a tape, and is separated into chips there. In the further course of the present disclosure, the tape will be used as an exemplary example. However, the use of a rigid carrier is conceivable as well. The chips are thus only produced, after the substrate has been fixed onto the tape.

In a first process step of the method, the fixation of the carrier, in particular of the tape, occurs on a fixation, in particular a dicing frame. If the carrier is a rigid carrier, this process step can be forgone, or the rigid carrier can be fixed to a substrate holder/carrier holder, respectively.

In a second, optional process step, the bond surface of the substrate, from which the later bond surfaces of the chips are produced, is cleaned. The cleaning can be one of the already-mentioned cleaning types. In particular, the cleaning occurs by means of plasma and/or liquids and/or gases. In addition, a plasma treatment preferably leads to a plasma activation of the bond surface. The bond surface then only needs to be cleaned, if it has been contaminated by preceding processes in such a way that the contaminations are also transferred to the tape, or that contaminations are present, which would later prevent and/or negatively impact the formation of a direct bond. However, a cleaning of the bond surface of the substrate always occurs prior to the fixation.

In a third process step according to the invention, the substrate is fixed to the carrier with its, in particular cleaned, preferably plasma-activated bond surface. According to the invention, the tape is thereby designed in such a way that the contamination of the bond surface is as small as possible after the substrate is removed from the carrier. If the carrier is a rigid carrier, it may be necessary to provide the carrier surface with a protective layer prior to the fixation of the substrate. In the case of tapes, such a protective layer is already present for the most part.

Starting at the time of the contacting of the bond surface, the carrier furthermore also serves as the protection thereof and prevents a contamination of the bond surface. At least in the center of the substrate, the carrier is preferably mostly coated in such a way that a low adhesion between the bond surface of the substrate and the carrier prevails, while the carrier can in fact have an adhesive property in the peripheral region of the substrate. The regions with a high adhesive strength, thus with a higher adhesive force, will likely create a contamination on the substrate periphery, which can preferably be neglected, as long as no regions of the bond surface are affected, from which chips will be produced later. The tape is preferably designed in such a way that the adhesive force decreases by means of energy input into the tape (UV, heat) and the chips can thus be removed more easily later. Such tapes are known in the prior art.

However, tapes with a particularly small contamination are preferably used for the process according to the invention.

The tapes preferably have adhesives, which cannot penetrate into the bond surface, in particular into the reservoirs, which were produced by means of the plasma activation, which had been performed beforehand. This is preferably ensured in that the adhesives have a very high viscosity, which prevents a penetration into the nano-porous surface. More preferably, the molecules of the adhesive are so large that a penetration into the pores is not possible due to the large molecules. The pores are in particular smaller than 10 nm, more preferably smaller than 5 nm, most preferably smaller than 1 nm, even more preferably smaller than 0.5 nm, most preferably of all smaller than 0.2 nm. The pore sizes are also disclosed in WO2012100786A1. It is most preferable that the adhesives are solids, which are bonded in a polymer matrix. Preferably, a cleaning with solvents can be forgone by means of such a design of the adhesives after removal of the tape, and a storage of solvents in the reservoir, which has been created by means of plasma-activation on the surface of the bond surfaces, are thus prevented. This results in improved bonding results, because an outgassing of the solvents after the bonding and thus the formation of bubbles in the bond boundary surface can thus be prevented.

The production of such a reservoir is disclosed in publications WO2012100786A1, WO2012136267A1, WO2012136268A1, WO2012136266A1 and WO2014015899A1.

In a highly preferred embodiment according to the invention, however, the carrier is coated in such a way that it can fix the substrate across its entire surface, does not leave a contamination on the substrate and the chips, which are produced later, can be removed easily.

In a fourth process step according to the invention, the substrate is separated. The separation can be performed by means of any method, if it does not contaminate the bond surface. In the further course of the present disclosure, some separating methods will be discussed in more detail, with the help of which it is ensured that the bond surface is kept clean according to the invention during the separation.

In a fifth process step according to the invention, the separated chips are removed from the carrier by means of a machine, in particular a chip bonder. In a particularly preferred embodiment according to the invention, a further, in particular continuous cleaning of the bond surface of the chip occurs during the removal and/or during the transport of the chip to a further position, in particular the bond position. This cleaning preferably occurs by means of plasma. The chips thereby either pass through a region, in which this cleaning occurs, or the removal of the chips from the carrier occurs in a room, in which this cleaning property occurs automatically. It is thus conceivable, for example, that the chips are removed from the carrier in a plasma chamber of the chip bonder. More preferably, the chips are moved past an atmospheric plasma source after the removal from the carrier. In particular, oxygen plasma is used, which preferably leads to the incineration of residues.

In a sixth process step according to the invention, the bond surface of the transported, separated chip is bonded with a second bond surface by means of a bond, in particular a direct bond or hybrid bond, respectively. An alignment process of the chip, which is generally performed relatively quickly, in relation to the second bond surface, to which it is to be bonded, thereby precedes the bonding process. Improvements according to the invention for the optimal bonding will be mentioned in more detail in other sections of the present disclosure. This alignment process preferably takes less than 5 seconds, more preferably less than 2 seconds, most preferably less than 1 second.

Method for the Separation

An essential aspect of the embodiment according to the invention lies in keeping the bond surface of a substrate or of the chips separated therefrom, respectively, clean. To ensure the cleanliness of the bond surface, the separating processes also need to cause a smallest possible contamination. In particular, no burrs may be created in response to the separation of a substrate. According to the invention, this can be ensured by means of a plurality of different processes.

In a first possible process, the so-called stealth dicing, a focused laser beam changes the material properties in such a way that an easy separation of the chips can occur. The advantage lies in particular in that mechanical separating agents, such as cutting wheels, can be forgone. The general mode of operation of the stealth dicing process is known in the prior art.

In a second possible process, the chips are separated from one another by the use of plasma.

In a third possible process, the chips are separated from one another by the use of mechanical separating agents. In a highly preferred embodiment according to the invention, grooves are created on the bond side here prior to an optional cleaning of the bond surface and the fixation of the substrate onto the carrier. In response to the separating process from the rear side of the substrate, the mechanical separating agents then hit the prefabricated grooves. By prematurely reaching the mechanical separating agents in the empty space, the grooves thus prevent a contamination of the bond surface of the individual chips.

The grooves can preferably also be used in the above-mentioned separating methods, because they can also lead to contaminations on the edge and/or burrs. In particular, when the breakage does not run continuously vertically through the wafer, in particular during the stealth dicing, for example due to the layer construction of the chips. The grooves are created in particular to avoid at least the formation of a burr on the bond surface.

The grooves can also be the result of a masking process, which is used in response to a deposition of a material on a surface. In response to such a process, no material is deposited at the masked locations. The masked regions then form the grooves.

Collective Bonding Devices and Methods

It may be disadvantageous in certain circumstance to bond chips by means of an individual bonding method. In particular when the bond surfaces of the chips need to be cleaned in order to obtain a high bond quality, it may be advantageous, to first position all chips on a carrier in such a way that the later bond surface points upwards. In this pre-fixation, all bond surfaces of the chips can then be cleaned and pretreated at the same time, in particular in a machine, which is provided for this purpose. In a further process step, all chips are then bonded onto the substrate, which is to actually be bonded, or onto the chips, which are to actually be bonded, respectively, at the same time.

In the case of such a collective bond, the planarity of the bond plane, which is formed by all bond surfaces of al chips, represents a quality feature, which is to essentially be met. In the ideal case, the bond surfaces of all chips need to coincide with one another.

Temporary Carrier

The following process describes the production of a temporary carrier with a plurality of chips, the bond surfaces of which coincide with one another, in order to perform a collective bonding process.

In a first process step according to the invention, a first carrier, in particular a carrier substrate, most preferably a carrier wafer, more preferably a tape, is coated with a protective layer on a dicing frame. In particular in response to the use of a tape, it is conceivable that the protective layer has already been applied to the tape. Apart from that, the coating of the carrier can occur with the common, known coating methods, such as spin-coating, spray-coating, laminating, etc.

In the alternative, it is also conceivable to provide the surface of the chips with a protective layer. This can already occur prior to cutting out the chips from the wafer.

In a second process step according to the invention, a plurality of chips are fixed to the first carrier with a very high alignment accuracy. The alignment in particular occurs with the help of alignment marks and optical systems. The alignment accuracy is thereby better than 1 mm, preferably better than 100 µm, more preferably better than 10 µm, most preferably better than 1 µm, most preferably of all better than 100 nm.

The fixation occurs via the later bond surface of the chips. The bond surfaces of the chips should coincide with one another, if possible. The protective layer should furthermore be as thin as possible, have a viscosity, which is as small as possible, and have an elasticity, which is as high as possible to prevent that the chips penetrate into the layer at different depths and thus destroy the coincidence of their bond surfaces. The thickness of the protective layer should preferably be as small as possible, so as to largely rule out an elastic behavior. The first carrier thus acts as infinitely stiff resistance, the protective layer acts exclusively as separator between bond surface and first carrier.

The e-module of a tape thereby lies between 1 GPa and 1000 GPa, preferably between 1 GPa and 500 GPa, more preferably between 1 GPa and 100 GPa, most preferably between 1 GPa and 50 GPa, most preferably of all between 1 GPa and 20 GPa. The e-module of polyamides lies between 3 and 6 GPa, for example.

The e-module of a stiffer carrier thereby lies between 1 GPa and 1000 GPa, preferably between 10 GPa and 1000 GPa, more preferably between 25 GPa and 1000 GPa, most preferably between 50 GPa and 1000 GPa, most preferably of all between 100 GPa and 1000 GPa. The e-module of some steel grades lies around 200 GPa, for example.

In a third process step according to the invention, a second carrier, in particular a carrier substrate, most preferably a carrier wafer, is coated with an adhesive. The second carrier is the temporary carrier. In contrast to the protective layer from the second process step according to the invention, the adhesive should be elastic and/or plastically adaptable, in order to compensate for possible height differences of the chips in such a way that the coincidence of the bond surfaces of the chips is not lost. The adhesive should thus have a viscosity, which is as small as possible, and an option for the lasting deformation.

At room temperature, the viscosity of the adhesive lies between $10E6$ mPa*s and 1 mPa*s, preferably between $10E5$ mPa*s and 1 mPa*s, more preferably between $10E4$ mPa*s and 1 mPa*s, most preferably of all between $10E3$ mPa*s and 1 mPa*s.

In a fourth process step according to the invention, the rear surfaces of the chips, which are located opposite to the bond surfaces of the chips, are connected to the temporary carrier. The coincidence of the bond surfaces of the chips on the first carrier side is maintained thereby, while the rear surfaces of the adhesive on the temporary carrier, if necessary, deform accordingly, in particular due to the preferably low viscosity. After the bonding process, the thickness of the adhesive between a chip and the temporary carrier can thus be different from chip to chip. In an expansion according to the invention, the removal of the adhesive between the chips is possible. An alignment between the first carrier and the temporary carrier preferably occurs via alignment marks, which are located on the first carrier and the temporary carrier. It is also conceivable that the alignment marks are located on the surfaces of the chips and that they are aligned to alignment marks on the temperature carrier. Aligners for aligning substrates are described in detail in publications U.S. Pat. No. 6,214,692B1, WO2015082020A1, WO2014202106A1.

In a fifth process step according to the invention, the first carrier comprising the protective layer is removed. The adhesive effect between the adhesive, the temporary carrier and the chip is thus in particular higher than the adhesion between the protective layer and the bond surface of the chips. In a particularly preferred embodiment according to the invention, the protective layer is designed in such a way that the detachment from the bond surface of the chip occurs without contamination, in particular completely. If the first carrier is a tape, the latter can be pulled off, which facilitates the removal. It may also be necessary to chemically change the protective layer with the help of chemicals and/or electromagnetic radiation, in particular UV light, visible light or infrared light and/or heat or with regard to the mechanical properties, so that it loses or at least reduces its adhesive property.

The bond strength between the protective layer and the chips is thereby smaller than 1 $J/m^2$, preferably smaller than 0.1 $J/m^2$, more preferably smaller than 0.01 $J/m^2$, most preferably smaller than 0.001 $J/m^2$, most preferably of all smaller than 0.0001 $J/m^2$.

In a sixth, optional process step, the in particular simultaneous cleaning and/or plasma activation of the exposed bond surfaces of the chips occurs. This measure is in particular significant, when the removal of the first carrier from the bond surfaces of the chips has not occurred in a completely contamination-free manner. The cleaning of all chips can in particular occur simultaneously this time, which increases the throughput of the method according to the invention.

In a seventh process step according to the invention, the simultaneous bonding process of all chips, which are fixed to the temporary carrier, then occurs on a product substrate, in particular a wafer. This also includes the option of bonding the chips on the temporary carrier onto chips, which are already located on the product substrate. This creates an option for successively constructing a chip stack on a product substrate. An alignment between the temporary carrier and the product substrate preferably occurs via alignment marks, which are located on the carrier and the product substrate. It is also conceivable that alignment marks are located on the bond surfaces of the chips and that they are aligned to alignments marks on the product substrate.

In an eighth process step according to the invention, the removal of the temporary carrier from the chip occurs. It may be necessary to change the adhesive with the help of chemicals and/or electromagnetic radiation, in particular UV light, visible light or infrared light, and/or heat, or with regard to the mechanical properties, in particular the viscosity, so that it loses its adhesive property. The temporary carrier is preferably a carrier, which is transparent for the photons from a specific wavelength range of the EM spectrum. It is preferably a glass carrier. According to the invention, adhesives can thus be used, which can be destroyed from the rear side with the help of a laser, so that a debonding option of the temporary carrier from the rear side thereof is possible.

In a ninth process step according to the invention, the adhesive is cleaned off the rear surface of the chip by means of one of the mentioned cleaning methods. After this process step, any further chips can be stacked on the available chips, so as to construct a chip stack on the product substrate in this way.

The positioning accuracy of the chips on the first carrier according to the process step two as well as the positioning of the chips on the temporary carrier by means of the collective bonding process according to process step seven is preferably made possible or is at least supported, respectively, by means of a self alignment of the chips. The positioning accuracy is thereby better than 1 mm, preferably better than 100 µm, more preferably better than 10 µm, most preferably better than 1 µm, most preferably of all better than 100 nm. The support by self alignment can only occur when a lateral shifting of the chips relative to the first carrier and/or relative to the temporary carrier is made possible. For this purpose, the protective layer on the first carrier and/or the adhesive on the temporary carrier need to have correspondingly small shear moduli or need to even provide for a plastic deformation, so that the chips can shift laterally.

Fixing Support

Instead of using the aforementioned temporary carriers, it is conceivable to fix the chips on a fixing carrier, which has corresponding fixing elements. The fixing elements can be vacuum fixations
electrostatic fixations
magnetic fixations
gel pack fixations.

The chips can be fixed directly to the fixing carrier with their rear surfaces. It is disadvantageous that, in contrast to the mentioned temporary carrier, no adhesive exists, with the help of which a standardization of the bond surfaces of all chips can take place in one plane. At best the resilience of a gel pack of the mentioned gel pack fixation provides for a similar effect. The ejector devices, which will be described later, can in particular also be used as fixing carriers.

Ejector Devices

In the further course of the present disclosure, a plurality of devices and methods will be described, in the case of which the accommodation and fixation of chips is necessary. All disclosed methods and devices thus refer to the already separated chips and the handling thereof, which, according to the invention, should always occur in such a way that the bond surface is no longer contaminated, if possible. These embodiments, which are identified as ejector device, primarily have the task of fixing a plurality of chips, which have already been separated to perform a cleaning process on them and to prepare the bond surface thereof for the actual bonding process.

Ejector Devices Comprising Depression Design

To treat a first ejector device according to the invention around the bond surface of a chip and to delivery it directly to a bonding process, is the storage of the chips in a carrier. The carrier has depressions, in which chips can be positioned and/or fixed.

In a preferred embodiment, the contours of the depressions are congruent to the contours of the chips. In a further alternative according to the invention, the contours of the depressions can also differ from the contours of the chips. The depressions are in particular larger than the chips. The access of a cleaning liquid and/or of a plasma to the sides of the chips is promoted thereby. The distance between the contours of the chip and the contour of the depression is thereby smaller than 5 mm, preferably smaller than 1 mm, more preferably smaller than 0.5 mm, most preferably smaller than 0.1 mm, most preferably of all smaller than 0.05 mm.

Passages (hereinafter also referred to as lead-throughs), in particular holes, through which a lifting device can lift the chips, so as to make them accessible for a gripper (hereinafter also referred to as gripping head), are located on the bottom surfaces of the depressions. In a particularly preferred embodiment according to the invention, the height of a chip corresponds exactly to the depth of the depression. The bond surface to be cleaned and the carrier surface thus coincide. In particular a mechanical cleaning process is promoted by means of such an embodiment. Due to the fact that the chips do not protrude from the depression, they cannot be damaged mechanically. They furthermore do not disappear in the depression and can thus be reached optimally by all types of cleaning devices. The embodiment according to the invention is furthermore optimally suitable for the plasma cleaning of the chips, because, due to the created seamless flatness between the bond surface and the carrier surface, the homogeneity of the used plasma is very high. A high reproducibility and in particular an even cleaning, in particular an even plasma activation of the bond surfaces are ensured due to the high homogeneity.

All of the carriers provided in the present disclosure, which are used in a plasma chamber, should have specific properties. In particular, the carriers need to be comprised of a conductive material. The carriers thus preferably comprise electrics, in particular
    a metal, in particular
    an alloy, in particular
        steel
        aluminum
        stainless steel alloys
        titanium
    a conductive ceramic, in particular
        doped SiC
        doped $Si_3N_4$ Metallic carriers are preferably coated to prevent a contamination of the chips by the metals. Preferably, dielectrics, in particular oxides, nitrides or carbides are possible as coatings.

The carrier is preferably also embodied in two pieces, so that the chips sit on a metallic disk and a screen, which is comprised of a dielectric, in particular Si, SiC or $Si_3N_4$, is then attached for the plasma activation. In this case, the screen has similar or identical dielectric properties as the chips. A plasma, which is as even as possible, can thus be ensured. The screen in particular even comprises the same dielectric material as the chips.

The absolute amount of the difference of chip height h and the depth t of the depression is smaller than 1 mm, preferably smaller than 0.5 mm, more preferably smaller than 0.1 mm, most preferably smaller than 0.05 mm, most preferably of all smaller than 0.01 mm.

The bond surfaces of a plurality of chips can be treated simultaneously by means of the embodiment according to the invention, which results in an extreme efficiency increase of the cleaning of chips, which have already been separated.

After the ejection of the chip in a well-defined height, a gripping head is used to accommodate and to transport the chip. The gripping head thereby does not fix the chip on the bond surface, which has just been cleaned, but on the fixing surface located opposite to the bond surface. The fixing surface can in particular be contaminated in these process steps. In further process steps, however, the fixing surface can become a new bond surface, onto which a further chip can be placed, and then needs to be cleaned accordingly.

In the case of the described ejector device, the depth t of the depression is specified. If chips comprising slightly different chip heights h are fixed according to the invention, their bond surfaces, which are to be cleaned, no longer coincide to one another. It is conceivable in this case that that lifting device performs a height correction of some chips, in particular of the chips, the chip heights h of which are smaller than the depths t of the depressions.

Ejector Device Comprising Attachment Design

A further second ejector device according to the invention is comprised of a carrier, in which passages, in particular holes, are located. In contrast to the previous first ejector design, this ejector device does not have any depressions. The chips, which are to be cleaned, are fixed directly to the carrier surface. The surrounding atmosphere is in particular separated from the passages with the help of seals. It is thus possible to perform the cleaning of the chips, without performing a contamination of the passages by the cleaning agents, for example chemicals, such as fluids or ions, from the plasma. Fixing elements, which fix the chips, can be located inside the sealed space.

The fixing elements are at least one of the following fixations
    vacuum fixations (preferred)
    electrostatic fixations
    magnetic fixations
    adhesive fixation,
    mechanical fixations (least preferred)

Most preferably, vacuum fixations are used, which can evacuate the passage as well as the space between the seals and which thus ensure a pressing of the chip onto the seals. The seals can either be solids, in particular polymers, or, in particular highly-viscous and/or cured polymers. The seals are then preferably waxes, adhesives, glues, etc. These polymers need to be replaced routinely, because they are removed over time, in particular by means of cleaning processes, which are performed.

Masks

In an expansion according to the invention, in particular for the mentioned ejector devices, a mask comprising an aperture is used, in order to protect the bond surfaces of chips from contamination. The chips are always seized via machine components, which necessarily need to move across the chips. In addition to the actual gripping head and a corresponding arm, on the end of which the gripping head is located, cables and lines also need to be moved. All of these machine elements necessarily contribute to the contamination of the bond surfaces of the chips, when they move across them.

In a particularly preferred embodiment according to the invention, a relative movement occurs between the mask comprising aperture and the chips. Preferably, the device, on which the chips are located, moves. It is also conceivable that the mask moves. For removing a chip, the aperture is positioned above the chip, which is to be removed. The lifting device lifts the chip, which is to be bonded, beyond the mask. On the upper side of the mask, a gripping head removes the chip via its rear surface, without touching its bond surface, and transports it to a position, at which it is further processed. In particular, a capturing of the alignment marks of the chip by means of a first lens occurs as next step. The chip is then moved under the position, which is to be bonded, and is then positioned and bonded in a highly accurate manner, in particular with the help of a second lens, relative to the position, which is to be bonded. According to the invention, it is thus possible that the position, at which the chip is bonded, is located far outside the chip removal. The chip can furthermore pass through a plurality of stations until the actual bonding process, in particular alignment and/or measuring and/or cleaning, and/or test station, etc. According to the invention, only the rear surface of the chip is touched during the entire chip transport, but never the bond surface thereof. The gripping head thus fixes the chip, preferably starting at the time of removal from the lifting device until the finalization of the bonding.

In a specific embodiment, the product substrate, on which a chip is to be bonded, is located directly above the chips, which are to be bonded. All other chips, and thus the bond surfaces thereof, are protected from contamination by the mask surface again. The ejector unloads the chip from the ejector device and bonds it directly onto a product substrate or onto a chip/chip stack of a product substrate, respectively. The bond surfaces of the product substrate or of the chips of the product substrate, respectively, thereby face the ejector directly, thus point in the gravitational direction. A contamination of the bond surface of the chips, which need to still be ejected, on the ejector device is prevented by the mask. This embodiment according to the invention is less preferred than the above-mentioned embodiment, in the case of which a gripping head transports the chip to another location and bonds it there, because no further process steps can be performed at the chip in this alternative.

For all embodiments, the mask itself needs to be contamination-free thereby. In particular, the mask can be cleaned by means of one of the mentioned cleaning methods between an assembly process. The mask is mainly used for bonding processes, in which a substrate, which is to be equipped with chips, is positioned with its bond surface in gravitational direction. The mask according to the invention thereby prevents the transfer of contaminations of the substrate or of moving machine elements to the chips, which are located below the substrate. The masks are in particular used with the ejector devices, which are described in detail in the present disclosure. In these embodiments, in particular a rotation and thus a contacting of the chips on their bond surfaces can be forgone. The exact embodiments are described in detail in other sections of the present disclosure, as well as in a figure and the corresponding figure description.

A top-down flow furthermore prevails in clean rooms. The air thus always circulates from higher positions into lower positions and thereby drags along dust particles. The flow direction also has a disadvantageous effect on the contamination of the bond surfaces. It is conceivable according to the invention that provision is made in the vicinity of the devices, in which a plurality of chips is fixed to the exposed bond surfaces, in particular in the mentioned ejector devices or fixing carriers to machines, which produce a lateral flow to laterally discharge dust particles.

Bond Head

In a further embodiment according to the invention, a fixing device for fixing and bonding a chip is described. This fixing device is also identified as bond head and describes a machine component, which is responsible for the fixation, the transport and the bonding of the individual chips on a bond surface. To be able to utilize the advantages according to the invention of a clean bond surface on the chip, it is necessary to be able to control the bonding process as much as possible. It is in particular absolutely necessary that a chip does not first bond on the edge, but that a bond wave spreads out from the center of the chip to the outside. The concept of the bond wave is already known to the person of skill in the art from the wafer-to-wafer (W2W) bonding. Reference is made here to the publications WO2014191033A1, PCT/EP2016053268, PCT/EP2016056249 and PCT/EP2016069307, only to mention a few.

In contrast to the mentioned W2W methods, C2W methods, however, have extremely high throughputs. The fixing device moves at a very high speed from the pick-up location of the chip to the bond position and back. Due to the high speeds, which need to be reached quickly, the accelerations are also relatively high. In particular, the acceleration in the z direction, i.e. normally to the bond surface, is also very high. This wanted physical fact can be used to construct a completely new type of fixing device, with the help of which it is possible to convexly form a chip simply due to the mass inertia, so as to thus ensure that the center of the bond surface of the chip contacts the second bond surface first.

The idea according to the invention is that the fixing device has spring elements on the periphery, the spring constant of which is smaller than the spring constant of a centrically located spring element. In a very particular embodiment according to the invention, the fixing surface is not supported peripherally at all, i.e. spring elements are forgone peripherally.

The ratio of the spring constant of a peripheral spring element to the spring constant of a centrically located spring element is thereby smaller than 1, preferably smaller than 0.1, more preferably smaller than 0.01, most preferably smaller than 0.0001, most preferably of all smaller than 0.00001.

BRIEF DESCRIPTION OF THE DRAWINGS

Further advantages, features and details of the invention follow from the description below of preferred exemplary embodiments as well as from the drawings.

FIG. 2a shows a first process step according to the invention of a second process according to the invention, FIG. 2b shows a second process step according to the invention of a second process according to the invention, FIG. 2c shows a third process step according to the invention of a second process according to the invention, FIG. 2d shows a fourth process step according to the invention of a second process according to the invention, FIG. 2e shows a fifth process step according to the invention of a second process according to the invention, FIG. 6 shows a mask according to the invention with aperture in a second embodiment according to the invention, FIG. 7a shows a first process step according to the invention of a self alignment, FIG. 7b shows a second process step according to the invention of a self alignment, FIG. 8a shows a first process step according to the invention of a bonding process with bond head according to the invention, FIG. 8b shows a second process step according to the invention of a bonding process with bond head according to the invention.

Identical components or components with the identical function are identified with the identical reference numerals in the figures.

DETAILED DESCRIPTION OF THE INVENTION

Figure 1A:
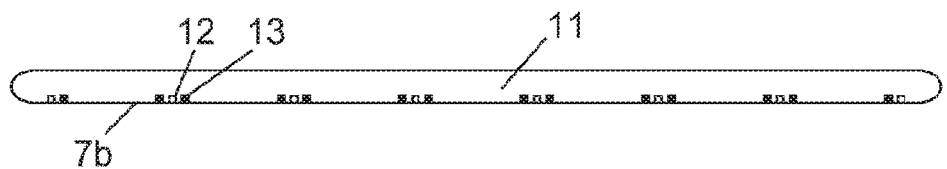
FIG. 1a shows a first process step according to the invention of a first process according to the invention.

FIG. 1a shows a first process step according to the invention of a first process according to the invention for producing an end product 19 according to the first process according to the invention. All preparations for the production of a plurality of chips are performed on a substrate 11. The preparations include the production of all functional properties of the chip, in particular contacts 13. Grooves 12 can furthermore be precut, in order to promote the later separating process. By performing all preparatory steps, a bond surface 7b can already be contaminated.

Figure 1B:
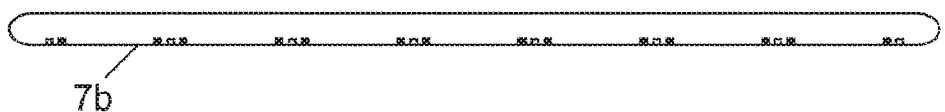
FIG. 1b shows a second process step according to the invention of a first process according to the invention.

FIG. 1b shows a second process step of the first process according to the invention, a cleaning step of the bond surface 7b. The bond surface 7b is in particular cleaned and/or activated by means of plasma and/or wet-chemical methods.

Figure 1C:
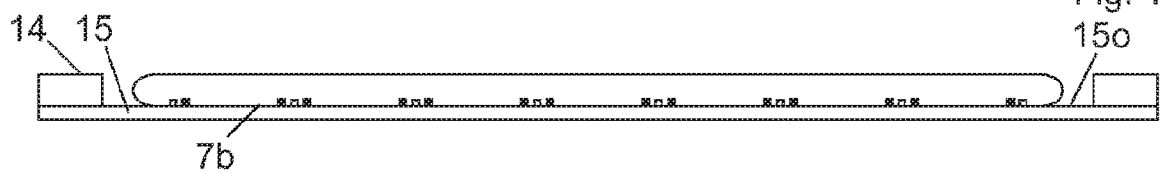
FIG. 1c shows a third process step according to the invention of a first process according to the invention.

FIG. 1c shows a third process step of the first process according to the invention, in which a fixation of the substrate 11 onto a carrier, in particular a tape 15, occurs. A tape surface 15o is preferably designed in such a way that a fixation of the substrate 11 occurs across the bond surface 7b, but that a later removal of the tape 15 does not leave any residues on the bond surface 7b.

Figure 1D:
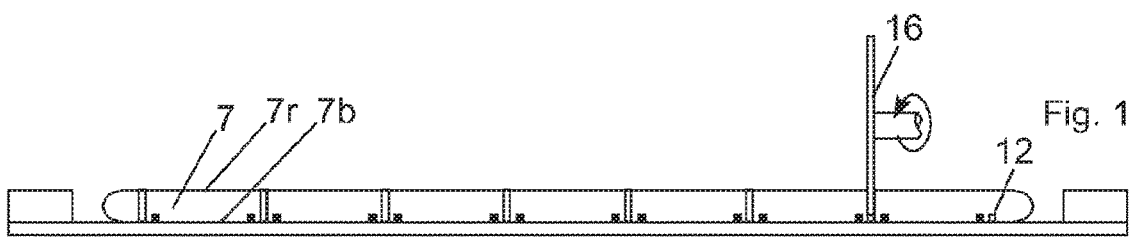
FIG. 1d shows a fourth process step according to the invention of a first process according to the invention.

FIG. 1d shows a fourth process step of the first process according to the invention, in which a separation of the substrate 11 into individual chips 7 occurs. According to the invention, the bond surface 7b of the chips 7 must not be contaminated thereby. In particular in response to a mechanical separation by means of a separating device 16, the grooves 12 are thus preferably provided in the substrate 11, in order to be able to already end the separating process above the bond surface 7b. Separations by means of lasers, in particular by means of the known stealth technology, by means of chemicals, in particular by means of etching, preferably by means of dry etching, by means of plasma, etc. are also conceivable.

Figure 1E:
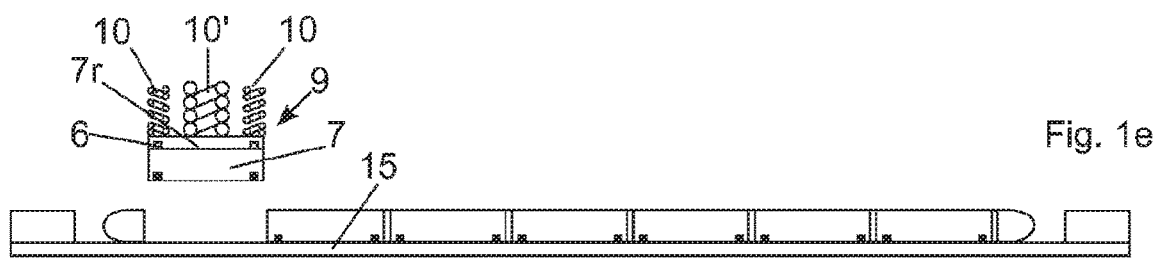
FIG. 1e shows a fifth process step according to the invention of a first process according to the invention.
Figure 1F:
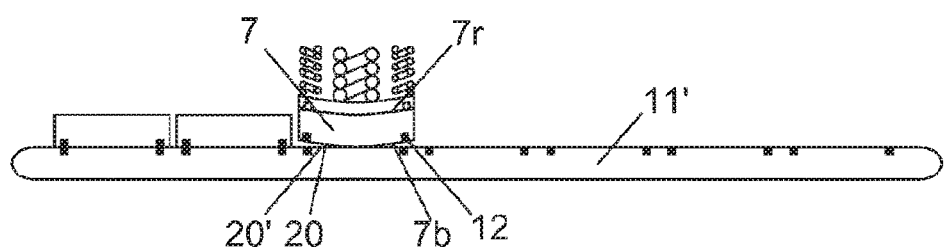
FIG. 1f shows a sixth process step according to the invention of a first process according to the invention.

FIG. 1e shows a fifth process step of the first process according to the invention, in which the chip 7 is removed from the tape 15 by means of a bond head 9, on which fixations 6 are located. The bond head 9 thereby fixes the chip 7 on its rear surface 7r, so that a contamination does not occur on the bond surface 7b.

Figure if shows a sixth process step of the first process according to the invention, in which the bond head 9 bonds to the further substrate 11', after an alignment of the chip 7 has occurred relative to a further substrate 11'. The bond surface 7b is thereby preferably a hybrid surface, which is comprised of a dielectric surface region 20 and an electric surface region, represented by the contacts 13. In the case of such a hybrid bond surface, a so-called prebond occurs between the dielectric surface region 20 of the bond surface 7b of the chip 7 and a dielectric surface region 20' of the substrate 11'.

Figure 1G:
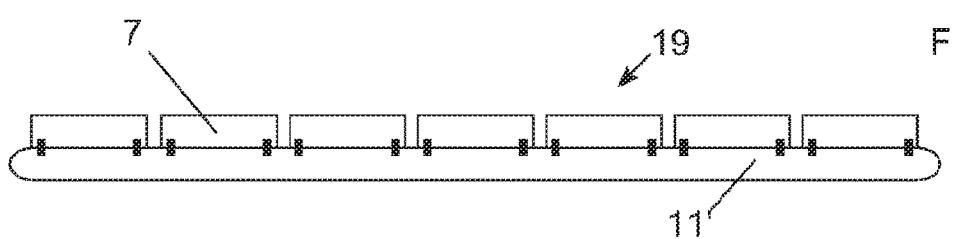
FIG. 1g shows a seventh process step according to the invention of a first process according to the invention.

FIG. 1g shows the end product 19 according to the invention of the first process according to the invention, comprised of the substrate 11' and a plurality of chips 7. The repetition of the mentioned process steps is conceivable, in order to stack further layers of chips 7 on top of the first layer of chips 7.

FIG. 2a shows a first process step according to the invention of a second process according to the invention, in which a plurality of chips 7, which have already been separated, are fixed with the bond surface 7b onto a carrier, in particular a tape 15. The bond surfaces 7b of the chips 7 had to already be cleaned and/or activated in a preceding process. The chips 7 are preferably aligned and positioned by means of a bond head 9 of a chip bonder. The enlargement shows the boundary surface between the bond surface 7b of a chip 7 and the tape surface 15o of the tape 15. A protective layer 17, which preferably also has adhesive properties, can be located on the tape surface 15o. Particularly preferably, the adhesive property between the protective layer 17 and the tape surface 15o, however, is larger than the adhesive property between the protective layer 17 and the bond surface 7b, so that a bond surface 7b, which is as contamination-free as possible, remains in response to a removal of the tape 15 in a later process step.

FIG. 2b shows a second process step according to the invention of the second process according to the invention, in which a substrate 11" is prepared as temporary carrier. An adhesive 18 is applied to the substrate 11" by means of a known method, in particular by means of a spin-coating process.

FIG. 2c shows a third process step according to the invention of the second process according to the invention, in which rear surfaces 7r of the chips 7 are contacted by means of the bonding adhesive. The contacting is in particular preceded by an alignment of all chips 7, which are fixed relative to one another, with regard to the substrate 11'. It is also conceivable in this process step that a mechanical pressure application, which is to ensure the coincidence of the bond surfaces 7b of all chips 7 in a plane E, occurs from the tape rear 15r. The plane E is thereby that plane, in which all bond surfaces 7b of the chips 7 are to be located. The plane E should in particular be identical with the surface of the protective layer 17, which is located in the direction of the chips 7. This is in particular relevant, when the carrier 15 is a tape. It is conceivable, for example, that a roller rolls across the tape rear 15r. However, an application across the entire surface, which results in a homogenous pressure distribution, is preferable.

FIG. 2d shows a fourth process step according to the invention of the second process according to the invention, in which the tape 15 was removed from the bond surfaces 7b of the chips 7. The tape 15 is preferably pulled off. It can be seen from the enlargement Z1 that the remainder of the protective layer 17 can remain on the bond surfaces 7b after the removal of the tape 15. In this, less preferred case, the chips need to be cleaned again in a further process step. After the removal of the tape 15, the bond surfaces 7b are preferably contamination-free. The enlargement Z2 shows an exaggerated illustration of two chips, which are located next to one another, which differ in their thicknesses d1 and d2. The resilience of the adhesive 18, however, ensures that the bond surfaces 7b are located in the same plane E, which represents an important aspect of the process according to the invention.

FIG. 2e shows an optional, less preferred fifth process step according to the invention of the second process according to the invention, in which the bond surfaces 7b of the chips 7 were cleaned by means of a cleaning process. The enlargement Z1 does no longer show a protective layer 17.

Figure 2F:
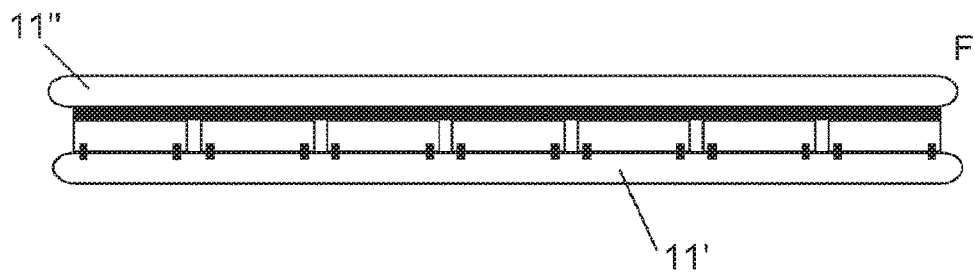
FIG. 2f shows a sixth process step according to the invention of a second process according to the invention.

FIG. 2f shows a sixth process step according to the invention of the second process according to the invention, in which the temporary carrier 11", which is equipped with the chips 7, is aligned relative to a further substrate 11' and is bonded. According to the invention, the bonding of all chips 7 occurs simultaneously.

Figure 2G:
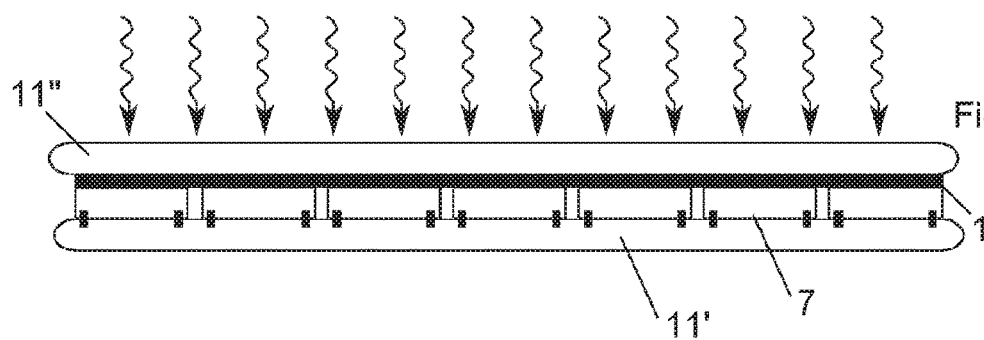
FIG. 2g shows a seventh process step according to the invention of a second process according to the invention.

FIG. 2g shows a seventh process step according to the invention of the second process according to the invention, in which the adhesive 18 is treated. The treatment can occur chemically and/or thermally and/or by means of EM waves, in particular by means of UV light or infrared. In a particularly preferred embodiment according to the invention, the treatment occurs by means of the temporary carrier 11". The treatment preferably has the result that the adhesive properties of the adhesive 18 are reduced or even eliminated completely, so that the temporary carrier 11" can be released from the chips 7.

Figure 2H:
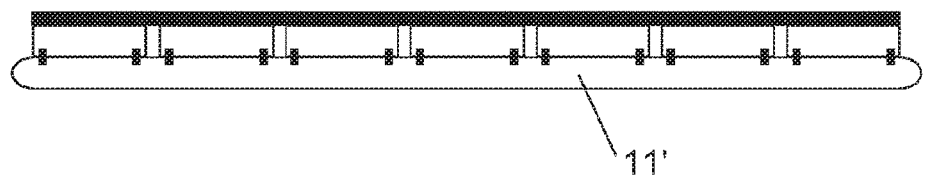
FIG. 2h shows an eighth process step according to the invention of a second process according to the invention.

FIG. 2h shows an eighth process step according to the invention of the second process according to the invention, in which the carrier substrate 11" is removed.

Figure 2I:
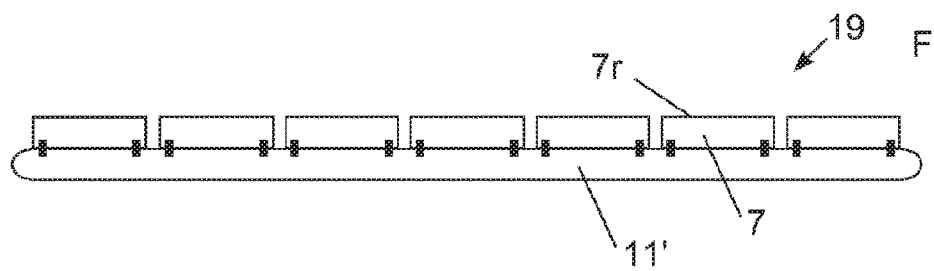
FIG. 2i shows a ninth process step according to the invention of a second process according to the invention.

FIG. 2i shows a ninth process step according to the invention of a second process according to the invention, in which the rear surfaces 7r of the chips 7 are cleaned. Again, the result is an end product 19.

Figure 3:
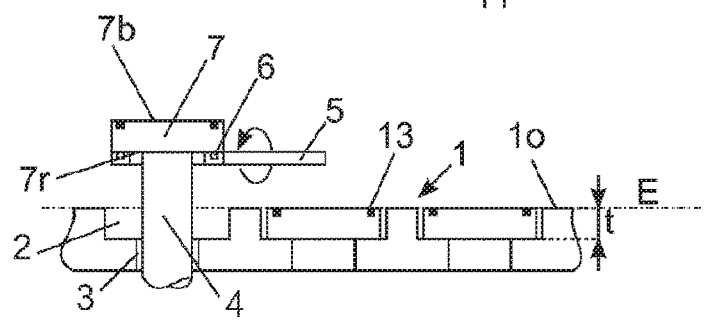
FIG. 3 shows a first ejector device according to the invention.

FIG. 3 shows a first embodiment according to the invention for mass cleaning and/or plasma activation and/or bonding of chips 7. The chips 7 are located in an ejector device 1, which has depressions 2. Lead-throughs 3, in particular simple holes, through which a lifting device 4 can lift and lower a chip 7, are attached to the bottom of the depressions 2. The loading and/or unloading of the chips 7 can occur via a gripping head 5, which can fix a chip 7 only on its rear surface 7r with the help of a fixation 6, in order to transport it. All of the bond surfaces 7b of all chips 7 preferably coincide during a mass cleaning and/or plasma activation inside the plane E. The coincidence of all bond surfaces 7b has the advantage of the homogenous treatment. It is thus ensured in particular in the case of a plasma treatment that the plasma density is homogenous across the entire surface. If the chips 7 should differ slightly in their thicknesses, the lifting devices can perform a slight correction in order to ensure the coincidence of the bond surfaces 7b again.

Figure 4:
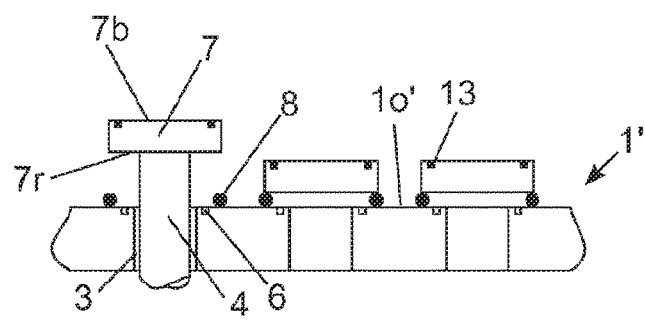
FIG. 4 shows a second ejector device according to the invention.

FIG. 4 shows a second embodiment according to the invention for the mass cleaning and/or plasma activation and/or bonding of chips 7.

The chips 7 are located in an ejector device 1', which has seals 8. The chips 7 can be loaded and/or unloaded by means of a lifting device 4, which can move translationally through lead-throughs 3. The fixation preferably occurs by means of fixations 6, in particular by means of vacuum channels, which permit the creation of a vacuum in the space in response to a contact of the chip 7 with the seal 8. For the sake of clarity, the gripping head 5 was not shown in this drawing.

The ejector devices 1, 1' thus serve for the general mass cleaning and/or plasma activation and/or bonding of separated chips 7. It is furthermore conceivable that the ejector devices 1, 1' themselves are constructed to be so compact that they can be used as carrier wafer 11" in terms of the second process according to the invention. In this case, the bond surfaces 7b of the chips 7 need to protrude slightly beyond the ejector surfaces 1o, 1o' at least prior to the bonding process to the substrate 11, which is automatically fulfilled in structural terms for the ejector surface 1o' of the ejector 1'. In particular the ejector device 1' is thus suitable as a type of fixing carrier. The fixations 6 can then also be electrostatic, magnetic or gel pack fixations.

Figure 5:
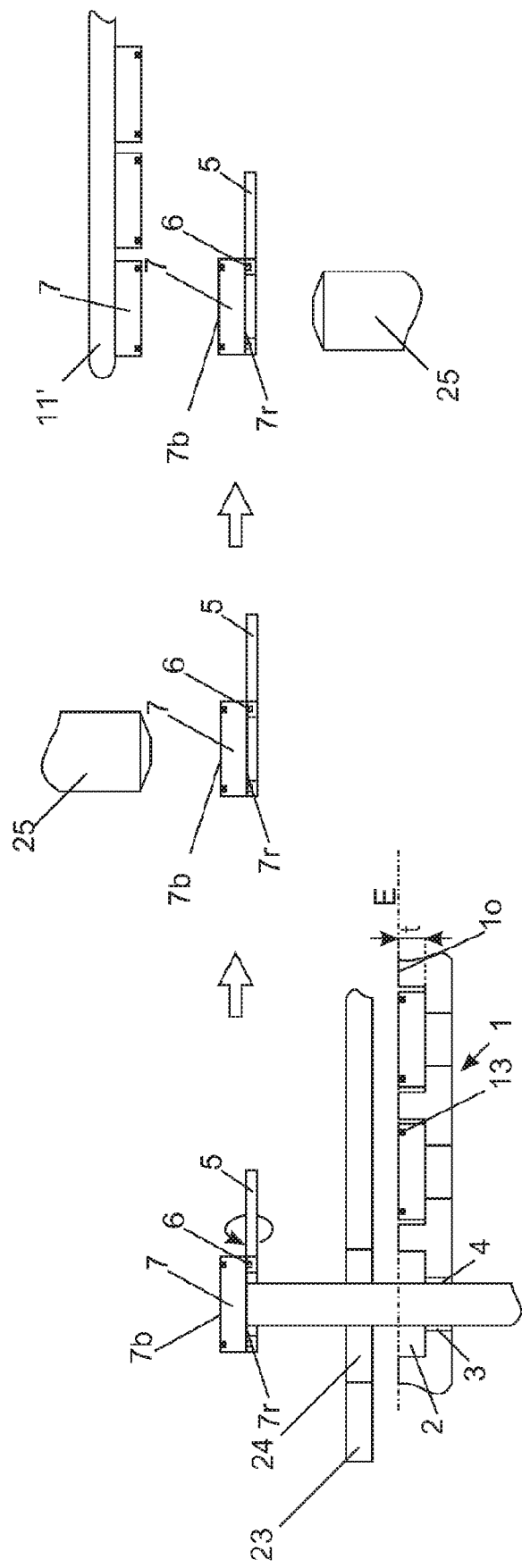
FIG. 5 shows a mask according to the invention with aperture in a first embodiment according to the invention.

FIG. 5 shows a first expansion of an embodiment according to the invention of the bonding, in which the ejector device 1 can be used in an exemplary manner to have a gripping head 5 accommodate a chip 7 through an aperture 24 of a mask 23. The accommodated chip 7 is transported, in particular across a plurality of stations. Lenses 25 can thereby measure the bond surfaces 7b and/or the rear surfaces 7r of the chips 7 and/or the substrate 11'. In particular, a search can be conducted for alignment marks (not shown) on the chips 7 and/or the substrate 11', in order to correctly position the transported chip 7. In this expansion, the substrate 11', which is to be equipped, is thus not located directly above the chips.

FIG. 6 shows a second expansion of an embodiment according to the invention of the bonding, in the case of which the ejector device 1' can be used in an exemplary manner, in order to bond a chip 7 through an aperture 24 of a mask 23 to a chip 7 of a substrate 11'. The idea according to the invention lies in that the mask 23, which in particular is comprised of a high-purity material, which preferably does not have a surface contamination, protects the chips 7 on the ejector device 1', which is used in an exemplary manner, from contamination. According to the invention, it is thus shown again, how the bond surface 7b of the chips 7 can be protected from contamination. It goes without saying that any other type of device can be used instead of the ejector device 1', which is used in an exemplary manner, in order to guide the chip 7 through the aperture 24 and to bond it to the surface, which is located on the other side of the mask 23, of another chip 7 or of a substrate 11'.

FIG. 7a shows a process step according to the invention of a self alignment according to the invention of a chip 7 on a substrate 1'. The chip 7 is placed onto a liquid film 21 by means of a bond head 9. In a particular embodiment, the liquid film 21 is not distributed continuously across the entire substrate 1', but is present as drop or puddle only at those locations, at which the self alignment of chips 7 is to occur.

A non-optimal alignment of the contacts 13 of the chip 7 with the contacts 13 of the substrate 1' can be seen.

FIG. 7b shows a second process step according to the invention of the self alignment according to the invention of the chip 7 on the substrate 1'. The bond head 9 releases the fixation to the chip 7. Due to its lateral movability due to the presence of the liquid film 21, said bond head is now aligned in such a way that the contacts 13 of the chip 7 are as congruent as possible with the contacts 13 of the substrate 1'. The reason for this lies in the different bonding properties of the dielectric and electric regions. Those regions, which are hydrophilic, preferably attract hydrophilic regions. This interaction can preferably expand through media with at least partially polar character. Water is a dipole and, according to the invention, is thus particularly well suitable for this object.

FIG. 8a shows the bond head 9 according to the invention, including a fixing surface 22 comprising fixations 6. Spring elements 10, 10' comprising different spring constants, are located behind the fixing surface 22. The spring constant of the centrically installed spring element 10 is preferably larger than the spring constants of the peripherally installed spring elements 10'. An acceleration of the bond head 9 in the lateral direction has no impact on the shape of the fixing surface 22.

FIG. 8b shows the bond head 9 according to the invention in response to an acceleration in the normal direction of a surface, which is to be bonded. Due to the higher spring constant of the middle spring element 10, the inertia acts less strongly on the middle part of the fixing surface 22 or, in other words, the middle part of the fixing surface 22 follows and reacts more quickly than the peripheral part. The curvature is advantageously also attained by means of the quick approach of the contact surface and the air cushions, which are present. The dynamic pressure, which is created by means of the translational movement, on the fixing surface 22 would push the fixing surface symmetrically to the back in the case of identical spring elements. Due to the fact, however, that the peripheral spring elements 10' have a smaller spring constant than the middle spring element 10, they yield more easily, because they are more elastic. In addition to the inertia, the dynamic pressure, which is created, thus also effects a curvature. Due to this mechanical asymmetry, the fixing surface 22 and thus the chip 7, which is fixed thereto, is thus curved convexly and can create an optimal contact point 23 for a direct bond. It is thus ruled out that the chip 7 contacts laterally or flat at first.

LIST OF REFERENCE NUMERALS

1, 1' ejector device
1o, 1o' ejector surfaces
2 depression
3 lead-through
4 lifting device
5 gripping head
6 fixation
7 chip
7b bond surface
7r rear surface
8 seal
9 bond head
10, 10' spring elements
11, 11', 11" substrate
12 grooves
13 contacts
14 frame
15 tape
15o tape surface
15r tape rear
16 separating device
17 protective layer
18 adhesive
19 end product
20 dielectric surface
21 liquid
22 fixing surface
23 mask
24 aperture
25 lens
d1, d2 thickness
E coincidence plane
t depth
Z1, Z2 enlargements

What is claimed is:

1. A method for bonding a plurality of chips onto a first semiconductor substrate or onto further chips, wherein each chip is a rectangular part having been formed on a second semiconductor substrate, and wherein the method comprises:
    separating the second semiconductor substrate into the plurality of chips;
    positioning, by a bonding head, a hybrid bond surface of each of the plurality of separated chips onto the first semiconductor substrate or the further chips, said hybrid bond surface comprising an exposed dielectric surface region disposed in a first plane and an exposed electric surface region disposed in a second plane different from the first plane; and
    bonding said hybrid bond surface onto the first semiconductor substrate or the further chips by a direct bond, wherein bonding includes
        the bond head applying the hybrid bond surface to the first semiconductor substrate or the further chips such that a bond wave of the direct bond spreads from a center of each hybrid bond surface toward an outer edge of the respective hybrid bond surface, wherein applying includes curving the bond head by accelerating the bond head toward the first semiconductor substrate or the further chips, and
        the bond head releasing from fixation the hybrid bond surface.

2. The method according to claim 1, wherein separating the second semiconductor substrate into the plurality of chips includes:
    fixing the second semiconductor substrate onto a carrier, and
    separating the second semiconductor substrate into the plurality of chips.

3. The method according to claim 2, wherein the method includes:
    cleaning the hybrid bond surface of the second semiconductor substrate prior to the fixing of the second semiconductor substrate onto the carrier and separating the second semiconductor substrate into the plurality of chips.

4. The method according to claim 2, wherein the method includes:
    cleaning the hybrid bond surfaces of the plurality of separated chips while removing the plurality of chips from the carrier and/or while transporting the plurality of chips to further positions.

5. The method according to claim 4, wherein the further positions are bond positions.

6. The method according to claim 2, wherein the method includes:
    introducing grooves into the hybrid bond surface of the second semiconductor substrate before separating the second semiconductor substrate into the plurality of chips.

7. The method according to claim 2, wherein the carrier is a tape.

8. The method according to claim 2, wherein separating of the second semiconductor substrate into the plurality of chips includes use of a mechanical separating means.

9. The method according to claim 1, further comprising attaching a curvable bond head to at least one chip of the plurality of separated chips, and using the curvable bond head to curve the hybrid bond surface of the at least one chip.

10. The method according to claim 1, wherein the at least one chip of the plurality of separated chips comprises an integrated circuit.

11. A method for bonding a plurality of chips onto a first semiconductor substrate or onto further chips, wherein each chip is a rectangular part having been formed on a second semiconductor substrate, and wherein the method comprises:
- separating the second semiconductor substrate into the plurality of chips;
- positioning, by a bonding head, a hybrid bond surface of each of the plurality of separated chips onto the first semiconductor substrate or the further chips, said hybrid bond surface comprising an exposed dielectric surface region disposed in a first plane and an exposed electric surface region disposed in a second plane different from the first plane; and
- bonding said hybrid bond surface onto the first semiconductor substrate or the further chips by a direct bond, wherein bonding includes
- the bond head applying the hybrid bond surface to the first semiconductor substrate or the further chips such that a bond wave of the direct bond spreads from a center of each hybrid bond surface toward an outer edge of the respective hybrid bond surface, wherein applying includes curving the bond head by accelerating the bond head toward the first semiconductor substrate or the further chips, and
- the bond head releasing from fixation the hybrid bond surface, wherein the bond head applying the hybrid bond surface to the first semiconductor substrate or the further chips such that the bond wave of the direct bond spreads from the center of each hybrid bond surface toward the outer edge of the respective hybrid bond surface comprises:
- generating an inertial force on the bond head due to acceleration of the bond head toward the first semiconductor substrate or the further chips;
- opposing, in a central region of the bond head, the inertial force with a first force; and
- opposing, in an outer region of the bond head, the inertial force with a second force that is different than the first force, whereby the bond head curves due to the inertial force, the first force and the second force.

* * * * *